United States Patent
Wu et al.

(10) Patent No.: US 7,534,753 B2
(45) Date of Patent: May 19, 2009

(54) PH BUFFERED AQUEOUS CLEANING COMPOSITION AND METHOD FOR REMOVING PHOTORESIST RESIDUE

(75) Inventors: Aiping Wu, Macungie, PA (US); Roberto John Rovito, Quakertown, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 653 days.

(21) Appl. No.: 11/330,815

(22) Filed: Jan. 12, 2006

(65) Prior Publication Data

US 2007/0161528 A1    Jul. 12, 2007

(51) Int. Cl.
C11D 7/32    (2006.01)

(52) U.S. Cl. .......................... 510/175; 510/176; 134/1.3

(58) Field of Classification Search ................. 510/175, 510/176; 134/1.3
See application file for complete search history.

(56) References Cited

U.S. PATENT DOCUMENTS

| | | | | |
|---|---|---|---|---|
| 5,103,000 | A * | 4/1992 | Akiyama et al. ............... 544/69 |
| 5,674,374 | A * | 10/1997 | Sakurai et al. ............... 205/252 |
| 5,698,503 | A | 12/1997 | Ward et al. |
| 5,759,381 | A * | 6/1998 | Sakurai et al. ............... 205/253 |
| 5,792,274 | A | 8/1998 | Tanabe et al. |
| 5,905,063 | A | 5/1999 | Tanabe et al. |
| 5,962,385 | A | 10/1999 | Maruyama et al. |
| 5,972,862 | A | 10/1999 | Torii et al. |
| 6,033,993 | A * | 3/2000 | Love et al. ................... 438/745 |
| 6,136,711 | A * | 10/2000 | Grumbine et al. ........... 438/692 |
| 6,191,086 | B1 * | 2/2001 | Leon et al. ................... 510/175 |
| 6,197,733 | B1 | 3/2001 | Mikami et al. |
| 6,224,785 | B1 | 5/2001 | Wojtczak et al. |
| 6,232,024 | B1 * | 5/2001 | Kimura et al. ................. 430/26 |
| 6,235,693 | B1 | 5/2001 | Cheng et al. |
| 6,248,704 | B1 | 6/2001 | Small et al. |
| 6,261,745 | B1 | 7/2001 | Tanabe et al. |
| 6,280,651 | B1 | 8/2001 | Wojtczak et al. |
| 6,358,663 | B2 * | 3/2002 | Kimura et al. ............... 430/139 |
| 6,372,410 | B1 * | 4/2002 | Ikemoto et al. .............. 430/318 |
| 6,383,410 | B1 | 5/2002 | Wojtczak et al. |
| 6,554,912 | B2 | 4/2003 | Sahbari |
| 6,589,439 | B2 * | 7/2003 | Honda et al. ................. 216/107 |
| 6,627,587 | B2 * | 9/2003 | Naghshineh et al. ........ 510/175 |
| 6,638,899 | B1 | 10/2003 | Wakiya et al. |
| 6,656,894 | B2 * | 12/2003 | Peters et al. ................. 510/175 |
| 6,677,286 | B1 | 1/2004 | Rovito et al. |
| 6,740,629 | B2 * | 5/2004 | Ando et al. .................. 510/245 |
| 6,773,873 | B2 * | 8/2004 | Seijo et al. ................... 430/329 |
| 6,777,380 | B2 | 8/2004 | Small et al. |
| 6,821,352 | B2 | 11/2004 | Rovito et al. |
| 6,828,289 | B2 | 12/2004 | Peters et al. |
| 6,908,610 | B1 * | 6/2005 | Sato ........................... 424/85.1 |
| 7,049,464 | B2 * | 5/2006 | Kimura et al. ............... 562/104 |
| 7,247,208 | B2 * | 7/2007 | Hsu ............................... 134/3 |
| 7,253,111 | B2 * | 8/2007 | Liu et al. ..................... 438/691 |
| 7,262,243 | B2 * | 8/2007 | Otozawa et al. ............. 524/544 |
| 7,300,480 | B2 * | 11/2007 | Bian et al. ..................... 51/307 |
| 7,300,601 | B2 * | 11/2007 | Liu et al. .................... 252/79.1 |
| 7,361,603 | B2 * | 4/2008 | Liu et al. ..................... 438/693 |
| 7,361,631 | B2 * | 4/2008 | Egbe et al. ................... 510/175 |
| 7,393,819 | B2 * | 7/2008 | Hsu ............................ 510/175 |
| 7,427,362 | B2 * | 9/2008 | Liu ............................. 252/79.1 |
| 7,435,712 | B2 * | 10/2008 | Misra et al. ................. 510/175 |
| 2004/0016904 | A1 | 1/2004 | Baum et al. |
| 2004/0142835 | A1 | 7/2004 | Takashima |
| 2004/0224866 | A1 | 11/2004 | Matsunaga et al. |
| 2004/0266637 | A1 | 12/2004 | Rovito et al. |
| 2005/0215446 | A1 | 9/2005 | Wojtczak et al. |
| 2005/0250660 | A1 | 11/2005 | Takashima |
| 2006/0172905 | A1 | 8/2006 | Rovito et al. |

FOREIGN PATENT DOCUMENTS

GB    1 469 460 A    4/1977
WO    02/102952 A1    12/2002

OTHER PUBLICATIONS

U.S. Appl. No. 11/050,562, filed Feb. 3, 2005, Roberto J. Rovito, et al.

* cited by examiner

*Primary Examiner*—Gregory E Webb
(74) *Attorney, Agent, or Firm*—Geoffrey L. Chase

(57) ABSTRACT

A residue cleaning composition includes: (a) water; (b) a fluoride; (c) a pH buffer system including an organic acid and a base. The organic acid can be an aminoalkylsulfonic acid and/or an aminoalkylcarboxylic acid. The base can be an amine and/or a quaternary alkylammonium hydroxide. The composition is substantially free of an added organic solvent and has a pH ranging from about 5 to about 12. A method of removing residue from a substrate includes contacting the residue with the cleaning composition. A method for defining a pattern includes etching the pattern through a photoresist into a substrate, heating the patterned substrate to a temperature sufficient to ash the photoresist and provide a residue, and removing the residue by contacting the residue with the cleaning composition.

25 Claims, No Drawings

PH BUFFERED AQUEOUS CLEANING COMPOSITION AND METHOD FOR REMOVING PHOTORESIST RESIDUE

BACKGROUND OF THE INVENTION

The invention generally relates to a cleaning composition and process for removal of photoresist residue from semiconductor device substrates after plasma etching and ashing processes in the fabrication of integrated circuits.

Numerous steps are involved in the fabrication of microelectronic structures. Within the manufacturing scheme of fabricating integrated circuits, selective etching of different surfaces of the semiconductor is sometimes required. Historically, a number of vastly different types of etching processes, to selectively remove material, have been successfully utilized to varying degrees. Moreover, the selective etching of different layers, within the microelectronic structure, is considered an important step in the integrated circuit fabrication process.

In the manufacture of semiconductors and semiconductor microcircuits, it is frequently necessary to coat substrate materials with a polymeric organic substance. Examples of some substrate materials includes aluminum, titanium, copper, silicon dioxide coated silicon wafer, optionally having metallic elements of aluminum, titanium, or copper, and the like. Typically, the polymeric organic substance is a photoresist material. This is a material which will form an etch mask upon development after exposure to light.

In subsequent processing steps, at least a portion of the photoresist is removed from the surface of the substrate. One common method of removing photoresist from a substrate is by wet chemical means. The wet chemical compositions formulated to remove the photoresist from the substrate should do so without damaging the substrate (e.g., corroding, dissolving, and/or dulling the surface of any metallic circuitry of the substrate; chemically altering the inorganic substrate; and/or attacking the substrate).

Another method of removing photoresist is by a dry ash method where the photoresist is removed by plasma ashing using either oxygen or forming gas such as hydrogen. The residues or byproducts may be the photoresist itself or a combination of the photoresist, underlying substrate and/or etch gases. These residues or byproducts are often referred to as sidewall polymers, veils or fences.

Increasingly, reactive ion etching (RIE), is the process of choice for pattern transfer during via, metal line and trench formation. The RIE process typically leaves a residue or a complex mixture that may include re-sputtered oxide material, organic materials from photoresist, and/or antireflective coating materials used to lithographically define the vias, metal lines and or trench structures.

The prior art teaches a variety of cleaning compositions designed to remove residues and byproducts that result from semiconductor manufacturing processes. However, compositions that were once suitable for cleaning state of the art semiconductor materials are not as suitable for use with more recently developed materials, such as organosilica glass (OSG) dielectrics and other low-k dielectrics.

For example, U.S. Pat. No. 5,698,503 (Ward et al.), U.S. Pat. No. 5,792,274 (Tanabe et al.), U.S. Pat. No. 5,905,063 (Tanabe et al.), U.S. Pat. No. 5,962,385 (Maruyama et al.), U.S. Pat. No. 6,235,693 (Cheng et al.), U.S. Pat. No. 6,248,704 (Small et al.), U.S. Pat. No. 6,638,899 (Wakiya et al.), U.S. Pat. No. 6,677,286 (Rovito et al.), U.S. Pat. No. 6,773,873 (Seijo et al.), U.S. Pat. No. 6,821,352 (Rovito et al.) and U.S. Pat. No. 6,828,289 (Peters et al.), and U.S. Pat. App. Pub. No. 2004/0016904 (Baum et al.) disclose cleaning compositions comprising organic solvents. Organic solvents can be unsuitable for use with certain low-k dielectrics if they react with the organic and hydrogen substituents to produce a chemically altered dielectric material.

U.S. Pat. No. 6,197,733 discloses a cleaning composition comprising water, an ammonium fluoride compound, and an amphoteric surfactant of which the cationic group is an ammonium salt and of which the anionic group is a carboxylate. The patent is silent regarding the pH of the composition.

The pH of cleaning compositions is an important factor in their effectiveness in removing residues, etc. and in their compatability with substrates being cleaned. In the presence of highly acidic or alkaline aqueous formulations, the Si—O and Si—H bonds of low-k dielectrics can be converted to OH groups, thereby increasing the dielectric of the low-k dielectric. Moreover, highly acidic cleaning compositions containing hydrofluoric acid are not particularly suitable for use with aluminum, aluminum alloys containing copper, copper or carbon-doped oxide. It has therefore been proposed to use buffering agents in cleaning compositions to maintain the pH within a desired range.

For example, U.S. Pat. App. Pub. No. 2004/0266637 (Rovito et al.) discloses aqueous, buffered, fluoride containing compositions having a pH of greater than 7.0 to about 11.0. Buffered compositions are said to have an extended worklife because pH dependent attributes such as oxide and metal etch rates are stable so long as the pH remains stable.

U.S. patent application Ser. No. 11/050,562, assigned to Air Products and Chemicals, Inc., discloses a cleaning composition and method composition for removing residue wherein the composition has a pH ranging from about 2 to about 9, and the composition comprises: a buffer solution comprising an organic acid and a conjugate base of the organic acid in a molar ratio of acid to base ranging from 10:1 to 1:10; a fluoride, and water, provided that the composition is substantially free of an added organic solvent.

Despite the foregoing developments, it is desired to provide a selective cleaning composition and process capable of removing residues such as, for example, remaining photoresist and/or processing residues, such as for example, residues resulting from selective etching and/or ashing. Moreover, it is desired to provide a selective cleaning composition and process, capable of removing residues such as photoresist and/or post-etching/ashing residue, that exhibit high selectivity for the residue as compared to metals, high dielectric constant materials (referred to herein as "high-k" dielectrics), silicon, silicide and/or interlevel dielectric materials including low dielectric constant materials (referred to herein as "low-k" dielectrics), such as deposited oxides that might also be exposed to the cleaning composition. It is also desired to provide a composition that is compatible with and can be used with such sensitive low-k films as HSQ, MSQ, FOx, black diamond and TEOS (tetraethylsilicate).

All references cited herein are incorporated herein by reference in their entireties.

BRIEF SUMMARY OF THE INVENTION

Accordingly, there is provided in a first aspect of the invention, a composition for removing residue from a substrate, said composition comprising: (a) water; (b) at least one fluoride; and (c) a pH buffer system comprising: (i) at least one organic acid selected from the group consisting of an aminoalkylsulfonic acid and an aminoalkylcarboxylic acid; and (ii) at least one base selected from the group consisting of an amine and a quaternary alkylammonium hydroxide, provided that the composition is substantially free of an added organic solvent and has a pH ranging from about 5 to about 12.

In a second aspect of the invention, there is provided a method of removing residue from a substrate comprising contacting the residue with the inventive composition at a temperature and for a period of time effective to remove the residue from the substrate.

In a third aspect of the invention there is provided a method for defining a pattern comprising: coating a photoresist onto at least one portion of a substrate; lithographically defining a pattern on the photoresist; transferring the pattern onto the at least one portion of the substrate; etching the pattern into the substrate to form a patterned substrate; ashing the photoresist to provide a residue; and removing the residue by contacting the residue with the inventive composition.

DETAILED DESCRIPTION OF THE INVENTION

A composition and method comprising same for selectively removing residues from a substrate are disclosed herein. The composition disclosed herein is capable of selectively removing a residue, such as processing residue, from a substrate without attacking (to any undesired extent) structural materials of the substrate that might also be exposed to the composition.

As used herein, the term "residue" denotes an undesirable material present on the substrate. Residues that can be removed by the invention include but are not limited to: organic compounds, such as exposed and ashed photoresist material; ashed photoresist residue; UV- or X-ray-hardened photoresist; C-F-containing polymers; low and high molecular weight polymers and other organic etch residues; inorganic compounds such as metal oxides; ceramic particles from chemical mechanical planarization (CMP) slurries and other inorganic etch residues; metal containing compounds such as organometallic residues and metal organic compounds; ionic and neutral, light and heavy inorganic (metal) species; moisture; and insoluble materials, including particles generated by processing such as planarization and etching processes. In one particular embodiment, residues removed are processing residues such as those created by reactive ion etching and ashing.

The invention is suitable for removing residues from a variety of substrates. Suitable substrates include but are not limited to: metals, silicon, silicate and/or interlevel dielectric material such as deposited silicon oxides and derivatized silicon oxides such as HSQ, MSQ, FOx, TEOS and Spin-On Glass, and/or high-k materials such as hafnium silicate, hafnium oxide, barium strontium titanium (BST), $Ta_2O_5$, and $TiO_2$. Suitable substrate metals include but are not limited to copper, copper alloy, titanium, titanium nitride, tantalum, tantalum nitride, tungsten, and titanium/tungsten.

The specificity of the inventive compositions makes the invention particularly useful for applications in which the compositions will contact the substrate (including components of the substrate, such as metal, silicon, silicide, interlevel dielectric materials, high-k materials and/or low-k materials) as well as the residue to be removed. In addition, the composition disclosed herein may exhibit minimal etch rates of certain dielectric materials such as silicon oxide.

The composition disclosed herein comprises water, a fluoride and a buffer solution comprising an organic acid and a base. In certain embodiments, the composition is substantially free of, or contains 2% by weight or less, or 1% by weight or less of an added organic solvent. In certain embodiments, the composition is adjusted to a pH ranging from about 5 to about 12 and optionally includes a corrosion inhibitor and other additives that are typically used in compositions for removing ashed photoresist and/or processing residue. In one particular embodiment, the composition is comprised of a buffer solution in an amount necessary to obtain a composition with a pH ranging from 5 to 12; 65% by weight or greater of water; 0.1% by weight to 5% by weight of a fluoride; and up to 15% by weight of the optional corrosion inhibitor.

As mentioned previously, the composition described herein includes a buffer solution. The term "buffer solution" as used herein, is a solution that resists changes in pH as a result of small additions of acids or bases to the composition. The buffer solutions, when included in the compositions disclosed herein, provide a buffered composition with a pH adjusted to minimize corrosion of sensitive metals such as, for example, tungsten, copper, titanium, etc. The buffer solution is added in an amount that is necessary to obtain the desired pH range for the composition. The addition of the buffer solutions to the compositions disclosed herein prevents pH swings due to dilution with water or contamination by bases or acids.

The Normal ratio (i.e., equivalents/mole ratio) of the at least one organic acid to the at least one base is from 10:1 to 1:10, or 3:1 to 1:3, or substantially 1:1. The ratio of the buffer solution is adjusted as needed to attain the desired pH range of the composition. Buffers are typically thought of as weak acids and the widest buffering range against either an acid or a base is about one pH unit on either side of the $pk_a$ of the weak acid group.

The buffer solution contains at least one organic acid selected from the group consisting of an aminoalkylsulfonic acid and an aminoalkylcarboxylic acid. The organic acid preferably has a pKa from about 6 to about 11. Aminoalkylsulfonic acids are represented by Formula I:

(I)

where R is an aminoalkyl group, including but not limited to primary, secondary and tertiary aminoalkyl group, wherein suitable alkyl groups of the aminoalkyl group R include but are not limited to straight-chain alkyls, branched-chain alkyls, cyclic alkyls, heterocyclic alkyls, saturated alkyls, unsaturated alkyls, alkanes, alkyenes, alcohols, ethers, aldehydes, ketones, carboxylic acids, esters, amides, etc.

Non-limiting examples of suitable aminoalkylsulfonic acids are listed in Table 1 below.

TABLE 1

Aminoalkylsulfonic acids

| Abbreviated Name | Formal Name | pKa |
|---|---|---|
| MES | 2-(N-morpholino)ethanesulfonic acid | 6.1 |
| ACES | N-(2-acetamido)-2-aminoethanesulfonic acid | 6.8 |
| PIPES | 1,4-piperazinediethanesulfonic acid | 6.8 |
| MOPSO | 3-(N-morpholino)-2-hydroxypropanesulfonic acid | 6.9 |
| BES | N,N-bis(2-hydroxyethyl)-2-aminoethanesulfonic acid | 7.1 |
| MOPS | 3-(N-morpholino)propanesulfonic acid | 7.2 |
| TES | N-tris(hydroxyethyl)methyl-2-aminoethanesulfonic acid | 7.4 |
| HEPES | N-(2-hydroxyethyl)piperazine-N'-(ethanesulfonic acid) | 7.5 |
| DIPSO | 3-[N,N-bis(2-hydroxyethyl)amino]-2-hydroxypropanesulfonic acid | 7.6 |
| MOBS | 4-(N-morpholino)butanesulfonic acid | 7.6 |
| TAPSO | 3-[N-tris(hydroxymethyl)methylamino]-2-hydroxypropanesulfonic acid | 7.6 |
| HEPPSO | N-(2-hydroxyethyl)piperazine-N'-(2-hydroxypropanesulfonic acid) | 7.8 |
| POPSO | Piperazine-N,N'-bis(2-hydroxypropanesulfonic acid) | 7.8 |
| EPPS | N-(2-hydroxyethyl)piperazine-N'-(3-propanesulfonic acid) | 8 |
| HEPBS | N-(2-hydroxyethyl)piperazine-N'-(4-butanesulfonic acid) | 8.3 |
| TAPS | N-tris(hydroxymethyl)methyl-3-aminopropanesulfonic acid | 8.4 |
| TABS | N-tris(hydroxymethyl)methyl-4-aminobutanesulfonic acid | 8.9 |
| AMPSO | 3-[(1,1-dimethyl-2-hydroxyethyl)amino]-2-hydroxypropanesulfonic acid | 9 |
| CHES | 2-(N-cyclohexylamino)ethanesulfonic acid | 9.3 |
| CAPSO | 3-(cyclohexylamino)-2-hydroxy-1-propanesulfonic acid | 9.6 |
| CAPS | 3-(cyclohexylamino)-1-propanesulfonic acid | 10.4 |
| CABS | 4-(cyclohexylamino)-1-butanesulfonic acid | 10.7 |

Aminoalkylcarboxylic acids are represented by Formula II:

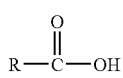

(II)

where R is an aminoalkyl group, including but not limited to primary, secondary and tertiary aminoalkyl groups, wherein suitable alkyl groups R of the aminoalkyl group include but are not limited to straight-chain alkyls, branched-chain alkyls, cyclic alkyls, heterocyclic alkyls, saturated alkyls, unsaturated alkyls, alkanes, alkyenes, alcohols, ethers, sulfides, thiols, aldehydes, ketones, carboxylic acids, esters, amides, etc.

Non-limiting examples of suitable aminoalkylcarboxylic acids are listed in Table 2 below.

TABLE 2

Aminoalkylcarboxylic acids

| Name | $pK_1$ | $pK_2$ | $pK_3$ |
|---|---|---|---|
| Glycine | 2.35 | 9.78 | |
| β-Alanine | 3.55 | 10.24 | |
| L-Serine | 2.19 | 9.21 | |
| L-Cysteine | 1.5 | 8.7 | |
| L-Asparagine | 2.1 | 8.8 | |
| L-Alanine | 2.34 | 9.87 | |
| L-Glutamine | 2.17 | 9.13 | |
| L-Isoleucine | 2.32 | 9.76 | |
| L-Leucine | 2.33 | 9.74 | |
| L-Methionine | 2.13 | 9.27 | |
| L-Phenylalanine | 2.2 | 9.31 | |
| L-Proline | 1.95 | 10.64 | |
| L-Threonine | 2.09 | 9.1 | |
| L-Tryptophan | 2.46 | 9.41 | |
| L-Tyrosine | 2.2 | 9.11 | 10.1 |
| L-Valine | 2.29 | 9.74 | |
| L-Aspartic acid | 1.99 | 3.9 | 9.9 |
| L-Glutamic acid | 2.13 | 4.31 | 9.67 |
| L-Arginine | 1.82 | 8.99 | 12.5 |
| L-Histidine | 1.8 | 6.04 | 9.33 |
| L-Lysine | 2.16 | 9.06 | 10.54 |

In certain embodiments, the organic acid within the buffer solution may also be present in the composition as the corrosion inhibitor and/or chelating agent.

Preferred bases for use in the buffer of the composition include amines and quaternary alkylammonium hydroxides. Further examples of the conjugate bases include hydroxylamines, organic amines such as primary, secondary or tertiary aliphatic amines, alicyclic amines, aromatic amines and heterocyclic amines, aqueous ammonia, and lower alkyl quaternary ammonium hydroxides. Specific examples of the hydroxylamines include hydroxylamine ($NH_2OH$), N-methylhydroxylamine, N,N-dimethylhydroxylamine and N,N-diethylhydroxylamine. Specific examples of the primary aliphatic amines include monoethanolamine, ethylenediamine and 2-(2-aminoethylamino)ethanol. Specific examples of the secondary aliphatic amines include diethanolamine, N-methylaminoethanol, dipropylamine and 2-ethylaminoethanol. Specific examples of the tertiary aliphatic amines include dimethylaminoethanol and ethyldiethanolamine. Specific examples of the alicyclic amines include cyclohexylamine and dicyclohexylamine. Specific examples of the aromatic amines include benzylamine, dibenzylamine and N-methylbenzylamine. Specific examples of the heterocyclic amines include pyrrole, pyrrolidine, pyrrolidone, pyridine, morpholine, pyrazine, piperidine, N-hydroxyethylpiperidine, oxazole and thiazole. Exemplary quaternary ammonium hydroxides may be those compounds having the formula $[N-R_1R_2R_3R_4]^+OH^-$ wherein $R_1$, $R_2$, $R_3$, and $R_4$ are each independently an alkyl group, a hydroxyalkyl group, and combinations thereof. The term "alkyl" as used herein refers to straight or branched chain unsubstituted hydrocarbon groups of 1 to 20 carbon atoms, or from 1 to 8 carbon atoms, or from 1 to 4 carbon atoms. Examples of suitable alkyl groups include methyl, ethyl, propyl, isopropyl, butyl, and tertbutyl. The expression "lower alkyl" refers to alkyl groups of 1 to 4 carbon atoms. The term "hydroxyalkyl" as used herein refers to straight or branched unsubstituted hydroxyl groups containing hydrocarbon groups of from 1 to 20 carbon atoms, or from 1 to 8 carbon atoms, or from 1 to 4 carbon atoms. Examples of suitable hydroxylalkyl groups include hydroxylethyl and hydroxypropyl. Examples of suitable quaternary ammonium hydroxide compounds include tetramethylammounium hydroxide (TMAH), tetraethylammonium hydroxide, tetrabutylammonium hydroxide (TBAH), tetrapropylammonium hydroxide, trimethylethylammonium hydroxide, (2-hydroxyethyl)trimethylammonium hydroxide, (2-hydroxyethyl)triethylammonium hydroxide, (2-hydroxyethyl)tripropylammonium hydroxide, (1-hydroxypropyl)trimethylammonium hydroxide, ethyltrimethylammonium hydroxide, diethyldimethylammonium hydroxide and benzyltrimethylammonium hydroxide. Among these bases, aqueous ammonia, monoethanolamine, N-methylaminoethanol, TMAH and TBAH are preferable from availability and safety standpoints. The bases may be used either alone or in combination with one another.

The buffer is provided such that the pH ranges from about 5 to about 12, or from about 6 to about 11.

Fluoride is present in the compositions described herein. Fluoride-containing compounds include those of the general formula $R_1R_2R_3R_4NF$ where $R_1$, $R_2$, $R_3$, and $R_4$ are independently hydrogen, an alcohol group, an alkoxy group, an alkyl group or mixtures thereof. Examples of such compounds include ammonium fluoride, tetramethyl ammonium fluoride (TMAF), tetraethyl ammonium fluoride, tetrabutyl ammonium fluoride, choline fluoride, and mixtures thereof. Still further examples of fluorides include fluoroboric acid, hydrofluoric acid, and choline fluoride. The fluoride is preferably present in amounts of from 0.01% by weight to 10% by weight or from 0.1% by weight to 5% by weight or from 0.2% by weight to 2.5% by weight. In certain embodiments, the fluoride is added to the composition in the form of a fluoride salt, such as, for example, TMAF. In this embodiment, TMAF may be available commercially as a 20% aqueous solution. In certain embodiments, the fluoride is added to the composition in the form of a fluoride salt, such as, for example, ammonium fluoride. In this embodiment, ammonium fluoride may be available commercially as a 40% aqueous solution.

As mentioned previously, water is also present in the composition disclosed herein. It can be present incidentally as a component of other elements, such as for example, an aqueous ammonium fluoride solution or an aqueous buffer solution, or it can be added separately. Some non-limiting examples of water include deionized water, ultra pure water, distilled water, doubly distilled water, or deionized water having a low metal content. Preferably, water is present in amounts of about 50% by weight or greater, or about 65% by weight or greater, or about 82.5% by weight or greater. In certain embodiments, water constitutes 65-99.7 wt. % of the composition, or 82.5-98.8 wt. % of the composition.

The compositions of the present disclosure can also optionally contain up to about 15% by weight, or about 0.2 to about 10% by weight of a corrosion inhibitor. Any corrosion inhibitors known in the art for similar applications, such as those disclosed in U.S. Pat. No. 5,417,877 which are incorporated herein by reference, may be used. A suitable corrosion inhibitor may be, for example, an organic acid, an organic acid salt, a phenol, a triazole, a hydroxylamine or acid salt thereof. Examples of particular corrosion inhibitors include citric acid, anthranilic acid, gallic acid, benzoic acid, isophthalic acid, maleic acid, fumaric acid, D,L-malic acid, malonic acid, phthalic acid, maleic anhydride, phthalic anhydride, benzotriazole (BZT), resorcinol, carboxybenzotriazole, diethyl hydroxylamine and the lactic acid and citric acid salts thereof, and the like. Further examples of corrosion inhibitors that may be used include catechol, pyrogallol, and esters of gallic acid. Particular hydroxylamines that can be used include diethylhydroxylamine and the lactic acid and citric acid salts thereof. Yet other examples of suitable corrosion inhibitors include fructose, ammonium thiosulfate, glycine, lactic acid, tetramethylguanidine, iminodiacetic acid, and dimethylacetoacetamide. In certain embodiments, the corrosion inhibitor may include a weak acid having a pH ranging from about 4 to about 7. Examples of weak acids include trihydroxybenzene, dihydroxybenzene, and/or salicylhydroxamic acid. In embodiments wherein the corrosion inhibitor is an organic acid, the organic acid may be the same as that used in the buffer solution. In certain embodiments, the corrosion inhibitors are mercapto-group containing compounds such as, but not limited to, 2-mercapto-5-methylbenzimidazole and 2-mercaptothiazoline. Still other examples of corrosion inhibitors include mercapto-group containing compounds which have a hydroxyl and/or carboxyl group on one side of the α- or β- position of the compound. Specific examples of these mercapto-group containing compounds include 3-mercapto-1,2-propanediol (which is also referred to as thioglycerol), 3-(2-aminophenylthio)-2-hydroxymercaptan, 3-(2-hydroxyethylthio)-2-hydroxypropylmercaptan, 2-mercaptopropionic acid, 3-mercaptoproponic acid, and mixtures thereof.

The composition may also include one or more of the following additives: surfactants, chelating agents, chemical modifiers, dyes, biocides, and other additives. The additive(s) may be added to the extent that they do not adversely affect the pH range of the composition. Some examples of representative additives include acetylenic alcohols and derivatives thereof, acetylenic diols (non-ionic alkoxylated and/or self-emulsifiable acetylenic diol surfactants) and derivatives thereof, alcohols, quaternary amines and di-amines, amides (including aprotic solvents such as dimethyl formamide and dimethyl acetamide), alkyl alkanolamines (such as diethanolethylamine), and chelating agents such as beta-diketones, beta-ketoimines, carboxylic acids, malic acid and tartaric acid based esters and diesters and derivatives thereof, and tertiary amines, diamines and triamines. In certain embodiments, the carboxylic acid that may be added to the composition in the buffer solution may also act as a chelating agent within the composition.

Materials removed with the compositions described herein include ashed photoresists and processing residues known in the art by such names as sidewall polymers, veils, fences etch residue, ash residue and the like. In certain preferred embodiments, the photoresist is exposed, developed, etched and ashed prior to contact with the composition described herein. The compositions disclosed herein are compatible with low-k films such as HSQ (FOx), MSQ, SiLK, etc. The formulations are also effective in stripping ashed photoresists including positive and negative photoresists and plasma etch residues such as organic residues, organometallic residues, inorganic residues, metallic oxides, or photoresist complexes at low temperatures with very low corrosion of tungsten, copper, titanium containing substrates. Moreover, the compositions are also compatible with a variety of high dielectric constant materials.

During the manufacturing process, a photoresist layer is coated on the substrate. Using a photolithographic process, a pattern is defined on the photoresist layer. The patterned photoresist layer is thus subjected to plasma etch by which the pattern is transferred to the substrate. Etch residues are generated in the etch stage. The patterned substrate is subsequently ashed to form a residue. When the substrates are ashed, the main residues to be cleaned are etchant residues.

The method described herein may be conducted by contacting a substrate having an organic or metal-organic polymer, inorganic salt, oxide, hydroxide, or complex or combination thereof present as a film or residue, with the described composition. The actual conditions, e.g., temperature, time, etc., depend on the nature and the thickness of the material to be removed. In general, the substrate is contacted or dipped into a vessel containing the composition at a temperature ranging from 20° C. to 80° C., or from 20° C. to 60° C., or from 20° C. and 40° C. Typical time periods for exposure of the substrate to the composition may range from, for example, 0.1 to 60 minutes, or 1 to 30 minutes, or 1 to 15 minutes. After contact with the composition, the substrate may be rinsed and then dried. Drying is typically carried out under an inert atmosphere. In certain embodiments, a deionized water rinse or rinse containing deionized water with other additives may be employed before, during, and/or after contacting the substrate with the composition described herein.

The invention will be illustrated in more detail with reference to the following Examples, but it should be understood that the present invention is not deemed to be limited thereto.

Exemplary compositions used in the Examples were prepared by combining deionized water, a fluoride, an organic acid and a base and mixing the components together in a vessel at room temperature until all solids have dissolved. The resulting compositions are shown in Table 3 below.

TABLE 3

Exemplary Compositions

| Comp. No. | Water (wt. %) | Fluoride (wt. %) | Organic Acid (wt. %) | Base (wt. %) | Corrosion Inhibitor (wt %) |
|---|---|---|---|---|---|
| 1 | 96.775 | TMAF (0.4) | MES (2.2) | TMAH (0.625) | |
| 2 | 97.375 | TMAF (0.4) | HEPES (1.6) | TMAH (0.625) | |
| 3 | 96.475 | TMAF (0.4) | DIPSO (2.5) | TMAH (0.625) | |
| 4 | 91.9 | TMAF (0.4) | EPPS (6.45) | TMAH (1.25) | |
| 5 | 96.825 | TMAF (0.4) | CHES (2.15) | TMAH (0.625) | |
| 6 | 95.32 | TMAF (0.4) | CAPS (3.03) | TMAH (1.25) | |
| 7 | 96.29 | TMAF (0.4) | Glycine (2.06) | TMAH (1.25) | |
| 8 | 95.85 | TMAF (0.4) | Glycine (1.5) | TMAH (1.25) | Thioglycerol (1.0) |
| 9 | 96.52 | TMAF (0.4) | β-Alanine (1.83) | TMAH (1.25) | |
| 10 | 95.65 | TMAF (0.4) | β-Alanine (1.7) | TMAH (1.25) | Thioglycerol (1.0) |

All of the compositions were tested for pH and etch rate. The pH determinations were made using 5% aqueous solutions at ambient temperature. The results are shown in Table 4 below.

TABLE 4 pH and Etch Rate Data

| Composition No. | pH | Etch Rate (Å/min) | | | | | |
|---|---|---|---|---|---|---|---|
| | | Cu | | TEOS | | JSR LEB-043 | |
| | | 25° C. | 40° C. | 25° C. | 40° C. | 25° C. | 40° C. |
| 1 | 6.44 | <1 | <1 | nt | <1 | nt | nt |
| 2 | 7.83 | 1 | 1 | nt | <1 | nt | nt |
| 3 | 7.93 | 2 | 3 | nt | <1 | nt | nt |
| 4 | 7.88 | 2 | 3 | nt | <1 | nt | nt |
| 5 | 9.68 | <1 | 1 | nt | <1 | nt | nt |
| 6 | 10.76 | 1 | nt | <1 | nt | <1 | <1 |
| 7 | 9.35 | 50 | nt | <1 | nt | nt | nt |
| 8 | 9.73 | 1 | 1 | nt | <1 | nt | nt |
| 9 | 10.13 | 83 | nt | <1 | nt | nt | nt |
| 10 | 10.01 | 1 | 1 | nt | <1 | nt | nt | nt: not tested

Etch rates were obtained on blanket silicon wafers containing copper, doped undensified tetraethylorthosilicate (TEOS) and JSR LEB-043, which is a porous methylsilsequioxane (MSQ) film provided by JSR, Inc. Measurements were conducted at 5, 10, 20, 40, and 60 minutes of exposure at temperature intervals of 25° C. and 40° C. Thickness measurements were determined at each time interval and graphed using a "least squares fit" model on the results for each exemplary composition. The calculated slope of the "least squares fit" model of each composition is the resultant etch rate provided in angstroms/minute (Å/min). In determining either the copper etch rate or oxide etch rate, the wafers had a blanker layer of a known thickness deposited upon it.

For the Cu etch rate, the initial thickness of the wafer was determined using the CDE ResMap 273 Four Point Probe. After determining the initial thickness, test wafers were immersed in the exemplary compositions. After five minutes, the test wafers were removed from the test solution, rinsed for three minutes with deionized water and completely dried under nitrogen. The thickness of each wafer was measured and if necessary the procedure was repeated on the test wafer.

For the TEOS and JSR LEB-043 etch rate, the initial thickness was determined using a FilmTek 2000 SE Spectroscopic Ellipsometer/Reflectomer. Approximately 200 ml of a test solution was placed in a 250 ml beaker with stirring and heated, if required, to the specified temperature. If only one wafer was placed in a beaker containing solution a dummy wafer was placed in the beaker. After five minutes, each test wafer was washed with deionized water for three minutes and dried under nitrogen. The substrates were then baked at a temperature of 110° C. for approximately 10 minutes. Measurements of each wafer were taken and if necessary the procedure was repeated.

The effectiveness of the exemplary compositions for removing residues from silicon wafer test substrates was tested. The wafers had a low-k, JSR LKD-5109 porous MSQ film (provided by JSR, Inc.), a titanium nitride barrier layer, a copper metallization layer, a BARC layer, and a photoresist pattern which was etched and ashed using a plasma etching and ashing process. The substrates were then processed by immersion in the exemplary composition. In this procedure, one or more test wafers were placed in a 600 ml beaker that contained 400 ml of each exemplary composition. The 600 ml beaker further included a 1 inch stir bar that rotated at 400 rpm. The exemplary composition having the wafer(s) contained therein was then heated for a specific time and at a specific temperature. After exposure to the exemplary composition, the wafer(s) were rinsed with deionized water and dried with nitrogen gas.

The wafers were cleaved to provide an edge and then examined using scanning electron microscopy (SEM) on a variety of pre-determined locations on the wafer. Residue removal efficacy and preservation of substrate were graded by visual inspection of SEM micrographs at 100,000 magnification. The results are shown in Table 5 below.

TABLE 5

Residue Removal Data

| Composition No. | Time (min) | Temperature (° C.) | Residue Removal | Substrate Damage |
|---|---|---|---|---|
| 1 | 15 | 40 | − | − |
| 2 | 15 | 40 | + | − |
| 3 | 15 | 40 | ++ | − |
| 4 | 15 | 40 | − | − |
| 5 | 15 | 40 | ++ | − |
| 6 | 15 | 40 | ++ | − |
| 7 | 15 | 40 | nt | nt |
| 8 | 15 | 40 | ++ | − |
| 9 | 15 | 40 | nt | nt |
| 10 | 15 | 40 | ++ | − | nt: not tested

| Code | Residue Removal | Substrate Damage |
|---|---|---|
| ++ | Substantially all | Unacceptably high |
| + | ~10% to ~90% | Insubstantial |
| − | Subtantially none | Substantially none (i.e., damage not visible at 100,000 magnification or an acceptable level of visible damage at such magnification) |

The invention claimed is:

1. A composition for removing residue from a substrate, said composition comprising:
   (a) water;
   (b) at least one fluoride; and
   (c) a pH buffer system comprising:
      (i) at least one organic acid selected from the group consisting of an aminoalkylsulfonic acid and an aminoalkylcarboxylic acid; and
      (ii) at least one base selected from the group consisting of an amine and a quaternary alkylammonium hydroxide,
   provided that the composition is substantially free of an added organic solvent and has a pH ranging from about 5 to about 12.

2. The composition of claim 1, further comprising at least one corrosion inhibitor adapted to inhibit corrosion of the substrate.

3. The composition of claim 2, wherein the at least one corrosion inhibitor is at least one member selected from the group consisting of citric acid, anthranilic acid, gallic acid, benzoic acid, malonic acid, maleic acid, fumaric acid, D,L-malic acid, isophthalic acid, phthalic acid, lactic acid, maleic anhydride, phthalic anhydride, catechol, pyrogallol, esters of gallic acid, benzotriazole, carboxybenzotriazole, fructose, ammonium thiosulfate, glycine, tetramethylguanidine, iminodiacetic acid, dimethylacetoacetamide, thioglycerol, trihydroxybenzene, dihydroxybenzene, salicyclhydroxamic, and mixtures thereof.

4. The composition of claim 1, wherein the at least one corrosion inhibitor is thioglycerol.

5. The composition of claim 1, further comprising at least one surfactant.

6. The composition of claim 5, wherein the at least one surfactant is at least one member selected from the group consisting of acetylenic alcohols, derivatives thereof, acetylenic diols and derivatives thereof.

7. The composition of claim 1, wherein the at least one fluoride has a composition of the general formula $R_1, R_2, R_3, R_4NF$ where $R_1, R_2, R_3$ and $R_4$ are independently hydrogen, an alcohol group, an alkoxy group, an alkyl group and mixtures thereof.

8. The composition of claim 7, wherein the at least one fluoride is a member selected from ammonium fluoride, tetramethyl ammonium fluoride, tetraethyl ammonium fluoride, tetrabutyl ammonium fluoride, choline fluoride, and mixtures thereof.

9. The composition of claim 1, wherein the at least one fluoride is tetramethyl ammonium fluoride.

10. The composition of claim 1, wherein the at least one organic acid is at least one member selected from the group consisting of MES, HEPES, DIPSO, EPPS, CHES and CAPS.

11. The composition of claim 1, wherein the at least one organic acid is at least one member selected from the group consisting of glycine and β-alanine.

12. The composition of claim 1 wherein the quaternary ammonium hydroxide compound comprises a compound having a general formula $[N-R_1R_2R_3R_4]^+OH^-$ wherein $R_1$, $R_2$, $R_3$, and $R_4$ are each independently an alkyl group, a hydroxyalkyl group, and mixtures thereof.

13. The composition of claim 12, wherein the quaternary ammonium hydroxide compound is selected from the group consisting of tetramethylammounium hydroxide, tetraethylammonium hydroxide, tetrapropylammonium hydroxide, tetrabutylammonium hydroxide, trimethylethylammonium hydroxide, (2-hydroxyethyl)trimethylammonium hydroxide, (2-hydroxyethyl)triethylammonium hydroxide, (2-hydroxyethyl)tripropylammonium hydroxide, (1-hydroxypropyl)trimethylammonium hydroxide, and mixtures thereof.

14. The composition of claim 1, wherein the at least one base is tetramethyl ammonium hydroxide.

15. The composition of claim 1, wherein the at least one fluoride is tetramethyl ammonium fluoride and the at least one base is tetramethyl ammonium hydroxide.

16. The composition of claim 1, wherein the at least one fluoride is tetramethyl ammonium fluoride, the at least one base is tetramethyl ammonium hydroxide, and the at least one organic acid comprises at least one member selected from the group consisting of MES, HEPES, DIPSO, EPPS, CHES and CAPS.

17. The composition of claim 1, wherein the at least one fluoride is tetramethyl ammonium fluoride, the at least one base is tetramethyl ammonium hydroxide, and the at least one organic acid comprises at least one member selected from the group consisting of glycine and β-alanine.

18. The composition of claim 1, wherein the water constitutes 65-99.7 wt. % of the composition, the at least one organic acid constitutes 0.1-20 wt. % of the composition, the at least one base constitutes 0.1-10 wt. % of the composition, and the fluoride constitutes 0.1-5 wt. % of the composition.

19. The composition of claim 18, wherein a Normal ratio of the at least one organic acid to the at least one base is from 10:1 to 1:10.

20. The composition of claim 1, wherein the composition is formulated so as to substantially avoid damaging the substrate.

21. A method of removing residue from a substrate comprising contacting the residue with a composition at a temperature and for a period of time effective to remove the residue from the substrate, wherein the composition comprises:
   (a) water;
   (b) at least one fluoride; and
   (c) a pH buffer system comprising:
      (i) at least one organic acid selected from the group consisting of an aminoalkylsulfonic acid and an aminoalkylcarboxylic acid; and
      (ii) at least one base selected from the group consisting of an amine and a quaternary alkylammonium hydroxide,
   provided that the composition is substantially free of an added organic solvent and has a pH ranging from about 5 to about 12.

22. The method of claim 21, wherein the temperature is from 20° C. to 80° C. and the period of time is from 1 to 30 minutes.

23. The method of claim 21, wherein all the residue on the substrate is removed without substantially damaging the substrate.

24. A method for defining a pattern comprising:
   coating a photoresist onto at least one portion of a substrate;
   lithographically defining a pattern on the photoresist;
   transferring the pattern onto the at least one portion of the substrate;
   etching the pattern into the substrate to form a patterned substrate;
   heating the patterned substrate to a temperature sufficient to ash the photoresist and provide a residue; and
   removing the residue by contacting the residue with a composition comprising:
   (a) water;
   (b) at least one fluoride; and
   (c) a pH buffer system comprising:
      (i) at least one organic acid selected from the group consisting of an aminoalkylsulfonic acid and an aminoalkylcarboxylic acid; and
      (ii) at least one base selected from the group consisting of an amine and a quaternary alkylammonium hydroxide,
   provided that the composition is substantially free of an added organic solvent and has a pH ranging from about 5 to about 12.

25. The method of claim 24, wherein the residue on the patterned substrate is removed without substantially damaging the patterned substrate.

* * * * *